United States Patent [19]

Buchwald et al.

[11] Patent Number: 5,304,321

[45] Date of Patent: Apr. 19, 1994

[54] CLEANING COMPOSITIONS, FORMED OF HYDROGEN-CONTAINING FLUOROCHLOROHYDROCARBONS AND PARTIALLY FLUORINATED ALKANOLS

[75] Inventors: Hans Buchwald, Ronnenberg; Andreas Brackmann, Hanover; Boleslaus Raszkowski, Wiedensahl, all of Fed. Rep. of Germany

[73] Assignee: Kali-Chemie AG, Hanover, Fed. Rep. of Germany

[21] Appl. No.: 850,854

[22] Filed: Mar. 13, 1992

Related U.S. Application Data

[62] Division of Ser. No. 611,884, Nov. 5, 1990, Pat. No. 5,135,676.

[30] Foreign Application Priority Data

Nov. 6, 1989 [DE] Fed. Rep. of Germany ....... 3936887
May 31, 1990 [DE] Fed. Rep. of Germany ....... 4017492

[51] Int. Cl.$^5$ .................. C11D 7/30; C11D 7/50; C23G 5/028
[52] U.S. Cl. ..................... 252/171; 134/12; 134/31; 134/38; 134/40; 134/42; 252/153; 252/162; 252/170; 252/364; 252/DIG. 9
[58] Field of Search ............... 252/153, 162, 170, 171, 252/364, DIG. 9; 134/12, 31, 38, 39, 40, 42

[56] References Cited

U.S. PATENT DOCUMENTS

| | | | |
|---|---|---|---|
| 3,330,776 | 7/1967 | Coe et al. | 252/364 |
| 3,509,061 | 4/1970 | Zisman et al. | 252/364 |
| 4,530,776 | 7/1985 | Hisamoto et al. | 252/153 |
| 4,578,209 | 3/1986 | Hisamoto et al. | 258/171 |
| 4,694,112 | 9/1987 | Willenberg et al. | 568/842 |
| 4,770,714 | 9/1988 | Buchwald et al. | 134/40 |
| 4,828,751 | 5/1989 | Kremer | 252/171 |
| 5,116,426 | 5/1992 | Asano et al. | 252/162 |
| 5,135,676 | 8/1992 | Buchwald et al. | 252/171 |

FOREIGN PATENT DOCUMENTS

| | | |
|---|---|---|
| 1248131 | 1/1989 | Canada . |
| 120319 | 10/1984 | European Pat. Off. . |
| 3335870 | 4/1985 | Fed. Rep. of Germany . |
| 55-131099 | 10/1980 | Japan . |
| 1-031898 | 2/1989 | Japan . |
| 1-138300 | 5/1989 | Japan . |
| 1-139779 | 6/1989 | Japan . |
| 1-139780 | 6/1989 | Japan . |
| 3-017029 | 1/1991 | Japan . |
| 3-017030 | 1/1991 | Japan . |
| 3-017031 | 1/1991 | Japan . |
| 3-017032 | 1/1991 | Japan . |
| 3-017033 | 1/1991 | Japan . |
| 3-017034 | 1/1991 | Japan . |
| 2188059 | 9/1987 | United Kingdom . |

OTHER PUBLICATIONS

Japanese Abstract, vol. 13 No. 221 (C-598) [3569] May 23, 1989.
*Research Disclosure* vol. 146 Disclosure No. 14623 (pp. 13-14) Jun. 1976.

*Primary Examiner*—Linda Skaling
*Attorney, Agent, or Firm*—Evenson, McKeown, Edwards & Lenahan

[57] ABSTRACT

Compositions suitable for use in cleaning processes formed of hydrogen-containing fluorochlorohydrocarbons selected from the group of consisting of tetrachloromonofluoroethanes, trichlorodifluoroethanes, dichlorotrifluoroethanes, dichloromonofluoroethanes and dichloropentafluoropropanes or a mixture one or more of these hydrogen-containing fluorochlorohydrocarbons in admixture with partially fluorinated alkanols containing two to four carbon atoms.

18 Claims, No Drawings

CLEANING COMPOSITIONS, FORMED OF HYDROGEN-CONTAINING FLUOROCHLOROHYDROCARBONS AND PARTIALLY FLUORINATED ALKANOLS

This application is a division of application Ser. No. 07/611,884 filed Nov. 5, 1990 now U.S. Pat. No. 5,135,676.

BACKGROUND OF THE INVENTION

The present invention relates to improved cleaning compositions formed of hydrogen-containing fluorochlorohydrocarbons with two to three carbon atoms in admixture with partially fluorinated alkanols with two to four carbon atoms, and to processes for cleaning surfaces of objects using such compositions.

Very high demands are made on solvents used for cleaning purposes. Such solvents should have a relatively low boiling point and be non-flammable and largely non-toxic and also have a high solvent power for the impurities which are to be removed. However, these demands cannot as a rule be met by only one single pure solvent. Therefore in practice a large number of solvent mixtures having compositions which differ to a greater or lesser extent are used. It is therefore generally known also to use mixtures of fluorochlorohydrocarbons (as the principal solvent) with a co-solvent in addition to pure chlorinated and/or fluorinated hydrocarbons for industrial cleaning processes or for vapor degreasing. Such mixtures may be either non-azeotropic or azeotropic or azeotrope-like. As used herein the term "azeotrope-like" refers to mixtures which boil at a substantially constant temperature across a relatively large concentration range (change in boiling temperature of not more than 5° C.) and which therefore behave similarly to azeotropes in practical use.

Although many attempts have already been made to produce cleaning compositions with the desired properties for different fields of use, the known mixtures are still in need of improvement in their use properties, toxicological properties and properties affecting the environment. For instance, technical advances in the field of fluxes have resulted in new requirements relating to the ability to remove these newly developed fluxes. These requirements are not always or frequently only unsatisfactorily met by the known solvent mixtures. Or other known solvents are multi-component systems of complicated composition or contain relatively large proportions of solvents which present toxicological and/or safety hazards (e.g. have a low flash point). In still other solvent compositions, it is desirable to find new solvents which are equally well suited for their respective purpose to replace other solvents which adversely affect the environment. Therefore there remains a need for new solvent mixtures with special properties which also are relatively safe toxicologically and environmentally.

SUMMARY OF THE INVENTION

It is therefore the object of the invention to provide new solvent mixtures which overcome the drawbacks of the prior art.

Another object of the invention is to provide solvent mixtures which are particularly well suited for use as cleaning compositions, especially for cleaning residues of modern soldering fluxes from printed circuit boards.

These and other objects of the invention are achieved by providing a composition consisting essentially of:
99.5 to 50.0% by weight of hydrogen-containing fluorochlorohydrocarbon with two to three carbon atoms selected from the group consisting of the tetrachloromonofluoroethanes, trichlorodifluoroethanes, dichlorotrifluoroethanes, dichloromonofluoroethanes, dichloropentafluoropropanes and mixtures of two or more of the foregoing, and
0.5 to 50.0% by weight of at least one partially fluorinated alkanol with two to four carbon atoms;
wherein the sum of the constituents equals 100% by weight.

DETAILED DESCRIPTION OF PREFERRED EMBODIMENTS

The invention relates to new compositions characterized by a content of 99.5 to 50.0% by weight of a hydrogen-containing fluorochlorohydrocarbon with two to three carbon atoms selected from the group of tetrachloromonofluoroethanes, trichlorodifluoroethanes, dichlorotrifluoroethanes, dichloromonofluoroethanes and dichloropentafluoropropanes or a mixture of these hydrogen-containing fluorochlorohydrocarbons, and 0.5 to 50.0% by weight of a partially fluorinated alkanol with two to four carbon atoms, or a mixture of these partially fluorinated alkanols, with the sum of the constituents being 100% by weight.

Tetrachloromonofluoroethanes within the scope of the invention are those fluorochlorohydrocarbons bearing one hydrogen atom having the empirical formula $C_2HCl_3F$. They therefore include the two isomeric, incompletely halogenated fluorochlorohydrocarbons 1,1,1,2-tetrachloro-2-fluoroethane (R121a) and 1,1,2,2-tetrachloro-1-fluoroethane (R121).

Trichlorodifluoroethanes within the scope of the invention are those fluorochlorohydrocarbons bearing one hydrogen atom having the empirical formula $C_2HCl_3F_2$. They therefore include the three isomeric, incompletely halogenated fluorochlorohydrocarbons 1,1,1-trichloro-2,2-difluoroethane (R122b), 1,1,2-trichloro-2,2-difluoroethane (R122) and 1,1,2-trichloro-1,2-difluoroethane (R122a).

Dichlorotrifluoroethanes within the scope of the invention are those fluorochlorohydrocarbons bearing one hydrogen atom having the empirical formula $C_2HCl_2F_3$. They therefore include the three isomeric, incompletely halogenated fluorochlorohydrocarbons 1,1-dichloro-2,2,2-trifluoroethane (R123), 1,2-dichloro-1,1,2-trifluoroethane (R123a) and 1,1-dichloro-1,2,2-trifluoroethane (R123b).

Dichloromonofluoroethanes within the scope of the invention are those fluorochlorohydrocarbons bearing one hydrogen atom having the empirical formula $C_2H_3Cl_3F$. They therefore include the three isomeric, incompletely halogenated fluorochlorohydrocarbons 1,2-dichloro-1-fluoroethane (R141), 1,1-dichloro-2-fluoroethane (R141a) and 1,1-dichloro-1-fluoroethane (R141b).

Dichloropentafluoropropanes within the scope of the invention are fluorochlorohydrocarbons bearing one hydrogen atom having the empirical formula $C_3HCl_2F_5$. They include the isomeric, incompletely halogenated fluorochlorohydrocarbons 1,2-dichloro-1,1,2,3,3-pentafluoropropane, 2,3-dichloro-1,1,1,2,3-pentafluoropropane, 1,1-dichloro-2,2,3,3,3-pentafluoropropane (=3,3-dichloro-1,1,1,2,2-pentafluoropropane), 1,3-dichloro-1,1,2,2,3-pentafluoropropane, 1,1- dichloro-1,2,2,3,3-pentafluoropropane, 1,2-dichloro-1,1,3,3,3-pentafluoropropane, 1,1-dichloro-1,2,3,3,3-pentafluoropropane. Preferred dichloropentafluoropropanes are 1,1-dichloro-2,2,3,3,3-pentafluoropropane (R225ca) and 1,3-dichloro-1,1,2,2,3-pentafluoropropane (R225cb).

Advantageously, the compositions particularly contain hydrogen-containing fluorochlorohydrocarbons selected from the group of dichlorotrifluoroethanes, dichloromonofluoroethanes, dichloropentafluoropropanes or mixtures thereof. Compositions in which the dichlorotrifluoroethane is the isomer 1,1-dichloro-2,2,2-trifluoroethane (R123) and the dichloromonofluoroethane is the isomer 1,1-dichloro-1-fluoroethane (R141b) or in which mixtures thereof are contained, are particularly preferred. Also preferred are compositions in which the dichloropentafluoropropane is the isomer 1,1-dichloro-2,2,3,3,3-pentafluoropropane (R225ca) or 1,3-dichloro-1,1,2,2,3-pentafluoropropane (R225cb) or a mixture of these two dichloropentafluoropropanes. However, compositions with other isomers, in particular of dichlorotrifluoroethane or dichloromonofluoroethane, i.e 1,2-dichloro-1,1,2trifluoroethane (R123a), 1,1-dichloro-1,2,2-trifluoroethane (R123b), 1,2-dichloro-1-fluoroethane (R141) and 1,1-dichloro-2-fluoroethane (R141a), are also highly suitable. Other advantageous compositions are those which contain 1,1,2,2-tetrachloro-2-fluoroethane (R121) or 1,1,2-trichloro-2,2-difluoroethane (R122) as hydrogen-containing fluorochlorohydrocarbon.

Partially fluorinated alkanols within the scope of the invention are those alkanols with two to four carbon atoms which contain hydrogen apart from the OH group and at least one fluorine atom. For example, the partially fluorinated alkanols with two to four carbon atoms contained in the compositions according to the invention may be selected from the group 2-fluoroethanol, 1,1-difluoroethanol-(2), 2,2,2-trifluoroethanol, 2-fluoropropanol, 3-fluoropropanol, 3,3-difluoropropanol, 2,2-difluoropropanol, 1,1-difluoropropanol-(2), 3,3,3-trifluoropropanol, 2,3,3,3-tetrafluoropropanol, 2,2,3,3-tetrafluoropropanol, 2,2,3,3,3-pentafluoropropanol,1,1,1,2,2-pentafluoropropanol-(3),4-fluorobutanol and 4,4,4-trifluorobutanol. Alkanols with two to three carbon atoms, such as 2,2,2-trifluoroethanol (hereinafter trifluoroethanol), 2,2,3,3-tetrafluoropropanol and in particular 2,2,3,3,3-pentafluoropropanol, are particularly preferred.

In an advantageous embodiment of the invention, binary or ternary compositions of one or two hydrogen-containing fluorochlorohydrocarbon(s) and a partially fluorinated alkanol are provided. Binary compositions of 1,1-dichloro-2,2,2-trifluoroethane (R123) and 2,2,2-trifluoroethanol, 2,2,3,3-tetrafluoropropanol or 2,2,3,3,3-pentafluoropropanol are advantageous, with binary compositions with 2,2,3,3,3-pentafluoropropanol being particularly suitable. Binary compositions of 1,1-dichloro-1-fluoroethane (R141b) and 2,2,3,3,3-pentafluoropropanol; and binary compositions of 1,1-dichloro-2,2,3,3,3-pentafluoropropane (R225ca) or 1,3-dichloro-1,1,2,2,3-pentafluoropropane (R225cb) on one hand with one of the alkanols 2,2,3,3-tetrafluoropropanol or 2,2,3,3,3-pentafluoropropanol on the other hand. The isomer isomer R225ca is especially preferred. Advantageous ternary compositions may contain 1,1-dichloro-2,2,2-trifluoroethane (R123), 1,1-dichloro-1-fluoroethane (R141b) and 2,2,3,3,3-pentafluoropropanol. Other advantageous ternary compositions are mixtures of the isomers R225ca and R225cb with one of the alkanols 2,2,3,3-tetrafluoropropanol or 2,2,3,3,3-pentafluoropropanol.

Some particularly advantageous embodiments of binary and ternary compositions of the invention are distinguished by azeotrope-like or azeotropic behavior. Such azeotropic or azeotrope-like compositions of solvents have a number of use-related advantages. First, they boil at a constant or substantially constant temperature, and second, while so doing the composition of the mixtures remains constant or substantially constant. If azeotropic or azeotrope-like compositions are used, therefore fractionation of the solvent constituents of the compositions does not occur, thus avoiding unwanted changes in properties, such as reduced solvent power, reduced inertness to the items to be cleaned or increased flammability when using flammable co-solvents. Furthermore, azeotropic or azeotrope-like compositions can be easily purified after use by conventional distillation and are thus readily available for re-use without the characteristics of the original composition being lost. However, it is not possible to predict the formation of azeotropic or azeotrope-like compositions, which renders the search for new azeotropic or azeotrope-like solvent systems more difficult.

It has now been discovered according to the invention that some binary compositions of 1,1-dichloro-2,2,2-trifluoroethane (R123) or 1,1-dichloro-1-fluoroethane (R141b) on one hand and 2,2,3,3,3-pentafluoropropanol on the other hand have very narrow boiling ranges and thus behave like azeotropes. One group of these special azeotrope-like compositions contains 98.5 to 96.5% by weight 1,1-dichloro-2,2,2-trifluoroethane (R123) in admixture with 1.5 to 3.5% by weight 2,2,3,3,3-pentafluoropropanol; these compositions boiling within a range of 27° to 30° C. (atmospheric pressure). The azeotropic composition with approximately 97.4% by weight 1,1-dichloro-2,2,2trifluoroethane (R123) and 2.6% by weight 2,2,3,3,3-pentafluoropropanol, which has a boiling point of approximately 27.2° C. at atmospheric pressure, is particularly advantageous. Another group of these special azeotrope-like compositions contains 96.0 to 94.0% by weight 1,1-dichloro-1-fluoroethane (R141b) in admixture with 4.0 to 6.0% by weight 2,2,3,3,3-pentafluoropropanol; these compositions boiling in a range of 33° to 37° C. (atmospheric pressure). The azeotropic composition with approximately 94.9% by weight 1,1-dichloro-1-fluoroethane (R141b) and 5.1% by weight 2,2,3,3,3-pentafluoropropanol, which has a boiling point of approximately 32.8° C. at atmospheric pressure, is particularly advantageous. It was further discovered according to the invention that some ternary compositions of 1,1-dichloro-2,2,2-trifluoroethane (R123), 1,1-dichloro-1-fluoroethane (R141b) and 2,2,3,3,3-pentafluoropropanol have very narrow boiling ranges and thus likewise behave like azeotropes. One group of these special ternary azeotrope-like compositions contains 44.0 to 49.0% by weight 1,1-dichloro-2,2,2-trifluoroethane (R123), 53.0 to 46.0% by weight 1,1-dichloro-1-fluoroethane (R141b) and 3.0 to 5.0% by weight 2,2,3,3,3-pentafluoropropanol; these compositions boiling within a range of 30° to 33° C. (atmospheric pressure). The azeotropic composition with approximately 46.4% by weight 1,1-dichloro-2,2,2-trifluoroethane (R123), 49.7% by weight 1,1-dichloro-1-fluoroethane (R141b) and 3.9% by weight 2,2,3,3,3-pentafluoropropanol, which has a boiling point of approximately 30.3° C. at atmospheric pressure, is particularly advantageous.

Furthermore, it has been discovered according to the invention that some binary compositions of 1,1-dichloro-2,2,3,3,3-pentafluoropropane (R225ca) on one hand and 2,2,3,3-tetrafluoropropanol or 2,2,3,3,3-pentafluoropropanol on the other hand have very narrow boiling ranges and thus behave like azeotropes. One group of these special azeotrope-like compositions contains 93.0 to 90.0% by weight 1,1-dichloro-2,2,3,3,3-pentafluoropropane (R225ca) in admixture with 7.0 to 10.0% by weight 2,2,3,3,3-pentafluoropropanol; these compositions boiling within a range of 48.5° to 52° C. (atmospheric pressure). The azeotropic composition with approximately 91.5% by weight 1,1-dichloro-2,2,3,3,3-pentafluoropropane (R225ca) and 8.5% by weight 2,2,3,3,3-pentafluoropropanol, which has a boiling point of approximately 48.6° C. at atmospheric pressure, is particularly advantageous. Another group of these special azeotrope-like compositions contains 98.0 to 96.0% by weight 1,1-dichloro-2,2,3,3,3-pentafluoropropane (R225ca) in admixture with 2.0 to 4.0% by weight 2,2,3,3-tetrafluoropropanol; these compositions boiling in a range from 49.5° to 53° C. (atmospheric pressure). The azeotropic composition with approximately 97.1% by weight 1,1-dichloro-2,2,3,3,3-pentafluoropropane (R225ca) and 2.9% by weight 2,2,3,3-tetrafluoropropanol, which has a boiling point of approximately 49.6° C. at atmospheric pressure, is particularly advantageous.

It is surprising that despite their relatively low alkanol content, the azeotropic or azeotrope-like compositions have very good solvent power and outstanding cleaning properties. This makes them particularly suitable for many purposes.

The compositions according to the invention are solutions which are clear at room temperature, to which known additives may be added (this means that the relative ratio of hydrogen-containing fluorochlorohydrocarbon to partially fluorinated alkanol, which is determined by the above percentage weight specifications, is not altered).

One group of known additives are stabilizers. This group comprises those compounds which prevent an undesirable reaction of constituents of the composition with each other or with other reactants, such as atmospheric oxygen, metal, water etc. Known stabilizers include, for example, nitroalkanes, in particular nitromethane, nitroethane, alkylene oxides, in particular butylene oxide, or branched alkynols such as 2-methyl-butyn-(3)-ol-(2). These stabilizers may be used individually or in combination, with quantities of 0.01 to 5% by weight, preferably from 0.05 to 1% by weight, relative to the total mixture, being suitable.

Another group of additives comprises known compounds selected from the group of corrosion inhibitors, non-ionic or ionic emulsifiers, dyes etc.

The aforementioned compositions have numerous possible uses in the cleaning and/or vapor degreasing fields. In these processes, the object to be cleaned is dipped into liquid and/or vaporous cleaning mixture or is sprayed with liquid cleaning mixture in one or more stages. The cleaning action may be increased in a known manner by using boiling temperatures and/or ultrasound and/or stirring. Likewise, the cleaning action may be enhanced by mechanical action, for instance brushing.

For instance, the electronics industry uses predominantly organic resin fluxes for soldering processes, the excesses of which have to be removed from circuit boards after the soldering operation. This is effected using organic solvents which are compatible with the circuit boards and the electronic components, i.e. the solvent must not react therewith. The resin fluxes to be removed are mixtures of polar and non-polar compounds and often additionally contain special activators. Fluorinated hydrogen-containing hydrocarbons alone, which are non-polar, are not effective for removing the polar components of the resins. Also they are not capable of completely removing in particular special high activator-containing fluxes. Surprisingly, the compositions of hydrogen-containing fluorochlorohydrocarbons and partially fluorinated alkanols according to the invention are able to remove both the polar and the non-polar constituents and are therefore effective on a broad basis as removal agents for resin fluxes, in particular for those having a high activator content. The compositions according to the invention, in particular the azeotropic and azeotrope-like compositions, are particularly well-suited for this use.

Thus circuit boards with or without attached components (in particular also with SMD-components) can be cleaned without difficulty using the compositions according to the invention, even when using fluxes having high activator contents, without the "white deposits" which are feared when using the conventional cleaning agents being produced.

The new compositions according to the invention are also desirable systems for coolants and lubricants, since the compositions have a low surface tension, low viscosity and for the most part a suitably high density. The above physical properties are those which are desired for lubricant applications. For instance, the compositions according to the invention are desirable if the mixture is used as a lubricant in metal-working machines, such as in drilling, milling, turning, thread-cutting, stamping or the like, where a residue-free surface is required. For these uses, known lubricant additives (as described, for instance, in U.S. Pat. No. 4,492,641 or published German Application No. DE 33 35 870) may also be added.

The low surface tension, the high wetting power and the density of the compositions according to the invention make them particularly suitable for cleaning capillary systems.

The compositions according to the invention may for instance also be used as follows:
for cleaning small parts or bulk material (preferably in closed installations);
for stripping paint, or
as special solvents, extraction agents and/or recrystallization agents in the chemical and pharmaceutical industries.

The cleaning compositions according to the invention formed of incompletely halogenated fluorochlorohydrocarbons selected from the group of tetrachloromonofluoroethanes, trichlorodifluoroethanes, dichlorotrifluoroethanes, dichloromonofluoroethanes and dichloropentafluoropropanes or a mixture of these hydrogen-containing fluorochlorohydrocarbons, which contain a partially fluorinated alkanol with two to four carbon atoms as a co-solvent, ensure to a high degree the high degree of purity which is necessary in special fields of use, for instance in cleaning components and circuit boards in the electronics industry. They are equal in their properties to prior art compositions of fully halogenated fluorochlorohydrocarbons, non-fluorinated or partially fluorinated alkanols and optionally other polar additives such as methyl acetate. It is all the more surprising that the new compositions according to the invention, unlike many mixtures of the prior art, also have outstanding cleaning properties without additional polar additives to increase the solvent power and are very well suited for the aforementioned uses. Another advantage of the compositions according to the invention is that they have increased flash points, and in the case of the azeotropes with 2 2,3,3,3-pentafluoropropanol or 2,2,3,3-tetrafluoropropanol even no flash points. The compositions according to the invention therefore permit new solutions to problems over a wide field of use. Furthermore, it is also advantageous that the incompletely halogenated fluorochlorohydrocarbon solvents used are more easily degraded and therefore are more environmentally compatible than fully halogenated fluorochlorohydrocarbons.

The following examples are intended to illustrate the invention in further detail without limiting its scope. Unless otherwise indicated, % always means % by weight.

EXAMPLE 1; CLEANING OF CIRCUIT BOARDS

Cleaning tests with circuit boards which were contaminated both with conventional halogen-containing soldering fluxes and with high-activator-containing soldering fluxes were carried out in a commercially available two-chamber or three-chamber cleaning unit. It was possible to remove from the circuit boards both the impurities due to conventional halogen-containing soldering fluxes and those due to soldering fluxes containing high amounts of activator, with outstanding cleaning results. The cleaning compositions, cleaning conditions and cleaning results are reproduced in Table 1. In this table, the name "trifluoroethanol" stands for 2,2,2-trifluoroethanol, "tetrafluoropropanol" for 2,2,3,3-tetrafluoropropanol and "pentafluoropropanol" for 2,2,3,3,3-pentafluoropropanol.

TABLE 1

| No. | Composition of Bath 1 | Cleaning conditions | Result |
|---|---|---|---|
| 1 | R123/trifluoroethanol: 80.0%/20.0% | 3-bath: 1) 3 min. ultrasound 2) 1 min. ultrasound 3) 1 min. vapor degreasing (in bath 2 & 3: R123) | ++ |
| 2 | R123/tetrafluoropropanol 65.0%/35.0 | 3-bath: 1) 3 min. ultrasound 2) 1 min. ultrasound 3) 1 min. vapor degreasing (in bath 2 & 3: R123) | ++ |
| 3 | R123/pentafluoropropanol: 98.5%/1.5% | 2-bath: 1) 3 min. ultrasound 2) 1 min. vapor degreasing (composition in bath 2 as in bath 1) | ++ |
| 4 | R123/pentafluoropropanol: 97.4%/2.6% | 2-bath: 1) 3 min. ultrasound 2) 1 min. vapor degreasing (composition in bath 2 as in bath 1) | ++ |
| 5 | R123/pentafluoropropanol: 50.0%/50.0% | 3-bath: 1) 3 min. ultrasound 2) 1 min. ultrasound 3) 1 min. vapor degreasing (in bath 2 & 3: R123) | ++ |
| 6 | R141b/pentafluoropropanol: 65.0%/35.0% | 3-bath: 1) 3 min. ultrasound 2) 1 min. ultrasound 3) 1 min. vapor degreasing (in bath 2 & 3: R141b) | ++ |
| 7 | R141b/pentafluoropropanol 96.0%/4.0% | 2-bath: 1) 3 min. ultrasound 2) 1 min. vapor degreasing (composition in bath 2 as in bath 1) | ++ |
| 8 | R141b/pentafluoropropanol: 94.9%/5.1% | 2-bath: 1) 3 min. ultrasound 2) 1 min. vapor degreasing (composition in bath 2 as in bath 1) | ++ |
| 9 | R141b/R123/pentafluoropropanol: 53.0%/44.0%/3.0% | 3-bath: 1) 3 min. ultrasound 2) 1 min. ultrasound 3) 1 min vapor degreas. (in bath 2 & 3: R123) | ++ |
| 10 | R141b/R123/pentafluoropropanol: 49.7%/46.4%/3.9% | 2-bath: 1) 3 min. ultrasound 2) 1 min. vapor (composition in bath 2 as in bath 1) | ++ |

In the cases marked "++" in the "Result" column, a very good cleaning effect was achieved without any formation of "white deposits". It is apparent that the compositions according to the invention exhibit outstanding cleaning power.

EXAMPLE 2: CLEANING OF CIRCUIT BOARDS, GLASS LENSES AND ALUMINUM PLATES

Cleaning tests with circuit boards which were contaminated both with conventional halogen-containing soldering fluxes and with high-activator-containing soldering fluxes were carried out in a commercially available two-chamber cleaning unit. It was possible to remove from the circuit boards both the impurities due to conventional halogen-containing soldering fluxes and those due to high-activator-containing fluxes with outstanding cleaning results. Furthermore, glass lenses and aluminum plates contaminated with oil and/or grease were cleaned. The cleaning compositions, cleaning conditions and cleaning results are reproduced in Table 2. In this table, the name "tetrafluoropropanol" stands for 2,2,3,3-tetrafluoropropanol and "pentafluoropropanol" for 2,2,3,3,3-pentafluoropropanol.

TABLE 2

| No. | Composition of Baths 1 and 2 | Cleaning Conditions | Material | Result |
|---|---|---|---|---|
| 1 | R225ca/tetrafluoropropanol: 97.1%/2.9% | 2-bath: 1) 3 min. ultrasound 2) 1 min. vapor degreasing | a) Circuit boards b) Glass lenses c) Aluminum plates | ++ ++ ++ |
| 2 | R225ca/pentafluoropropanol 91.5%/8.5% | 2-bath: 1) 3 min. ultrasound 2) 1 min. vapor | a) Circuit boards b) Glass lenses c) aluminum | ++ ++ ++ |

TABLE 2-continued

| No. | Composition of Baths 1 and 2 | Cleaning Conditions | Material | Result |
|---|---|---|---|---|
| | | degreasing | plates | |

In the cases marked "++" in the "Result" column, a very good cleaning effect was achieved without any formation of "white deposits". Glass lenses and aluminum plates were completely free of oil or grease after cleaning. It is apparent that the compositions according to the invention exhibit outstanding cleaning power.

EXAMPLE 3: CLEANING OF BULK MATERIAL a) Bulk material (transistor caps) was cleaned in a two-chamber unit (3 minutes ultrasound, 1 minute vapor degreasing) with an azeotropic mixture of 97.4% R123 and 2.6% 2,2,3,3,3-pentafluoropropanol in order to remove drawing oils. The bulk material was satisfactorily clean after treatment.

In analogous manner to a), bulk material was cleaned with azeotropic compositions of:

b) 94.9% R141b and 5.1% 2,2,3,3,3-pentafluoropropanol, or c) 49.7% R141b, 46.4% R123 and 3.9% 2,2,3,3,3-pentafluoropropanol, d) 97.1% R225ca and 2.9% 2,2,3,3-tetrafluoropropanol, e) 91.5% R225ca and 8.5% 2,2,3,3,3-pentafluoropropanol. After cleaning, the bulk material in cases b) to e) was likewise satisfactorily clean.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations falling within the scope of the appended claims and equivalents thereof.

What is claimed is:

1. A composition consisting essentially of an azeotrope-like composition of 98.5 to 96.5% by weight 1,1-dichloro-2,2,2-trifluoroethane (R123) and 1.5 to 3.5% by weight 2,2,3,3,3-pentafluoropropanol, with the sum of the constituents being 100% by weight, and having a boiling point in the range from 27° to 30° C. at atmospheric pressure.

2. A composition according to claim 1, having an azeotropic composition of approximately 97.4% by weight 1,1-dichloro-2,2,2-trifluoroethane (R123) and 2.6% by weight 2,2,3,3,3-pentafluoropropanol with a boiling point of approximately 27.2° C. at atmospheric pressure.

3. A composition consisting essentially of an azeotrope-like composition of 44.0 to 49.0% by weight 1,1-dichloro-2,2,2-trifluoroethane (R123), 53.0 to 46.0% by weight 1,1-dichloro-1-fluoroethane (R141b) and 3.0 to 5.0% by weight 2,2,3,3,3-pentafluoropropanol, with the sum of the constituents being 100% by weight, and having a boiling point in the range from 30° to 33° C. at atmospheric pressure.

4. A composition according to claim 3, having an azeotropic composition of approximately 46.4% by weight 1,1-dichloro-2,2,2-trifluoroethane (R123), 49.7% by weight 1,1-dichloro-1-fluoroethane (R141b) and 3.9% by weight 2,2,3,3,3-pentafluoropropanol with a boiling point of approximately 30.3° C. at atmospheric pressure.

5. A composition consisting essentially of an azeotrope-like composition of 98.0 to 96.0% by weight 1,1-dichloro-2,2,3,3,3-pentafluoropropane (R225ca) and 2.0 to 4.0% by weight 2,2,3,3-tetrafluoropropanol, with the sum of the constituents being 100% by weight, and having a boiling point in the range from 49.5° to 53° C. at atmospheric pressure.

6. A composition according to claim 5, having an azeotropic composition of approximately 97.1% by weight 1,1-dichloro-2,2,3,3,3-pentafluoropropane (R225ca) and 2.9% by weight 2,2,3,3-tetrafluoropropanol with a boiling point of approximately 49.6° C. at atmospheric pressure.

7. A composition according to claim 1, wherein 0.01 to 5% by weight of stabilizer selected from the group consisting of nitroalkanes, alkylene oxides, branched alkynols and mixtures of two or more of the foregoing is present.

8. A composition according to claim 7, containing from 0.05 to 1% by weight of stabilizer.

9. A process of cleaning a substrate comprising the step of contacting said substrate with a composition according to claim 1.

10. A process according to claim 9, wherein said substrate to be cleaned is a printed circuit board contaminated with soldering flux or soldering flux residue.

11. A composition according to claim 3, wherein 0.01 to 5% by weight of a stabilizer selected from the group consisting of nitroalkanes, alkylene oxides, branched alkynols and mixtures of two or more of the foregoing is present.

12. A composition according to claim 11, containing from 0.05 to 1% by weight of stabilizer.

13. A process of cleaning a substrate comprising the step of contacting said substrate with a composition according to claim 3.

14. A process according to claim 13 wherein said substrate to be cleaned is a printed circuit board contaminated with soldering flux or soldering flux residue.

15. A composition according to claim 5, wherein 0.01 to 5% by weight of a stabilizer selected from the group consisting of nitroalkanes, alkylene oxides, branched alkynols and mixtures of two or more of the foregoing is present.

16. A composition according to claim 15, containing from 0.05 to 1% by weight of stabilizer.

17. A process of cleaning a substrate comprising the step of contacting said substrate with a composition according to claim 5.

18. A process according to claim 17 wherein said substrate to be cleaned is a printed circuit board contaminated with soldering flux or soldering flux residue.

* * * * *